US006304082B1

(12) United States Patent
Gualtieri et al.

(10) Patent No.: US 6,304,082 B1
(45) Date of Patent: Oct. 16, 2001

(54) PRINTED CIRCUIT BOARDS MULTI-AXIS MAGNETOMETER

(75) Inventors: Devlin M. Gualtieri, Ledgewood; Robert E. Kollmyer, Bridgewater, both of NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/366,297

(22) Filed: Aug. 2, 1999

Related U.S. Application Data
(60) Provisional application No. 60/143,609, filed on Jul. 13, 1999.

(51) Int. Cl.[7] .................................................. G01R 33/02
(52) U.S. Cl. ......................... 324/252; 324/247; 338/32 R
(58) Field of Search .................................. 324/247, 252, 324/212, 207–217; 338/32 R, 32 M; 702/92; 33/356, 361

(56) References Cited

U.S. PATENT DOCUMENTS

| | | | |
|---|---|---|---|
| 4,109,199 | * 8/1978 | Ball et al. | 324/202 |
| 4,742,356 | * 5/1988 | Kuipers | 342/488 |
| 5,110,298 | 5/1992 | Dorinski et al. | 439/65 |
| 5,689,185 | * 11/1997 | Widdershoven et al. | 324/252 |
| 5,850,624 | 12/1998 | Gard et al. | 702/92 |

FOREIGN PATENT DOCUMENTS

2276727 * 5/1994 (GB).

WO 96 02847  2/1996 (WO) ................ G01R/33/02

* cited by examiner

Primary Examiner—Safet Metjahic
Assistant Examiner—Subhash Zaveri
(74) Attorney, Agent, or Firm—Loria B. Yeadon

(57) ABSTRACT

A multi-axis magnetometer is provided having three magnetic field sensing circuits for sensing a magnetic field along the X, Y and Z axes. Each magnetic field sensing circuit includes an operational amplifier and a bridge chip having at least one electrical conductor. The operational amplifier is electrically connected to the at least one electrical conductor of the bridge chip for receiving a portion of a current flowing through the at least one electrical conductor. The operational amplifier provides an output voltage based on a magnitude of the portion of the current flowing through the at least one electrical conductor. The multi-axis magnetometer further includes a voltage regulator for providing an operating voltage. A method is also provided for fabricating the multi-axis magnetometer which includes the steps of providing at least one bridge chip having at least one electrical conductor on a motherboard; providing at least one operational amplifier to the motherboard; electrically connecting the at least one electrical conductor to the at least one operational amplifier; providing at least one bridge chip having at least one electrical conductor on a daughterboard; providing at least one operational amplifier to the daughterboard; electrically connecting the at least one electrical conductor of the at least one bridge chip on the daughterboard to the at least one operational amplifier on the daughterboard; and attaching the daughterboard to the motherboard.

5 Claims, 5 Drawing Sheets

PRINTED CIRCUIT BOARDS MULTI-AXIS MAGNETOMETER

RELATED APPLICATION

This application claims priority to a provisional patent application filed by Gualtieri et al. on Jul. 13, 1999 and assigned U.S. Provisional Application No. 60/143,609, the contents of which are incorporated herein by reference.

FIELD OF THE INVENTION

The invention relates generally to magnetic field sensing devices, and more particularly to a multi-axis magnetic field sensing device and methods for fabricating the same.

BACKGROUND OF THE INVENTION

In the design and construction of printed circuit boards (PCBs), it is often desirable to sense and measure the intensity or direction (or both) of a magnetic field or of a component of a magnetic field in a particular direction. A device capable of sensing and measuring the magnetic field or a component of a magnetic field is a magnetometer. A magnetometer can be used to sense and measure the intensity of a component of a magnetic field along a particular dimension, such as the horizontal or vertical plane of a PCB. A horizontal-intensity magnetometer and a vertical-intensity magnetometer are typically used to sense and measure the magnetic field along the horizontal and vertical plane, respectively, of a PCB.

In the case where the PCB is flexible to allow positioning of the circuitry in a particularly shaped housing of an electronic device, it is preferred to use a magnetic field sensing device capable of sensing the magnetic field in more than one axis or dimension. Further, a magnetic field sensing device capable of sensing the magnetic field in more than one axis or dimension is also preferred when one or more additional PCBs, i.e., daughterboards, are electrically attached to a main PCB, i.e., motherboard, to allow increased functionality.

Attachment of daughterboards to motherboards is typically done using a connector so that the electrical configuration can be changed by replacing a daughterboard with another type. Permanent attachment of a daughterboard to a motherboard is sometimes desirable and this is generally achieved by conventional surface mount soldering techniques.

Accordingly, a need exists for a device capable of sensing and measuring a magnetic field along multiple axes. A need further exists for methods of fabricating the device capable of sensing and measuring the magnetic field along multiple axes.

SUMMARY OF THE INVENTION

The present invention provides a multi-axis magnetic field sensing device capable of sensing and measuring the magnetic field of a printed circuit board (PCB) in more than one dimension or axis and methods for fabricating the same. Preferably, the magnetic field sensing device of the present invention is assembled from individual magnetic field sensing circuit components which have a field sensitive axis in their mounting plane or along a particular plane.

According to the present invention, when sensing of only two orthogonal magnetic field components is desired, two such field sensing circuit components are mounted in an angular relationship to each other on the plane of a wiring board or PCB. When three orthogonal magnetic field components must be sensed or measured, at least one field sensing circuit component is mounted outside the plane of the other field sensing components. This is accomplished by first mounting the magnetic field sensing circuit component on a daughterboard, and then permanently attaching the daughterboard electrically and mechanically to a motherboard on which are mounted the other magnetic field sensing circuit components.

The multi-axis magnetometer of the present invention includes three magnetic field sensing circuits for sensing a magnetic field along the X, Y and Z axes. Each magnetic field sensing circuit includes an operational amplifier and a bridge chip having at least one electrical conductor. The operational amplifier is electrically connected to the at least one electrical conductor of the bridge chip for receiving a portion of a current flowing through the at least one electrical conductor. The operational amplifier provides an output voltage based on a magnitude of the portion of the current flowing through the at least one electrical conductor. The multi-axis magnetometer further includes a voltage regulator for providing an operating voltage.

A method is also provided for fabricating the multi-axis magnetometer which includes the steps of providing at least one bridge chip having at least one electrical conductor on a motherboard; providing at least one operational amplifier to the motherboard; electrically connecting the at least one electrical conductor to the at least one operational amplifier; providing at least one bridge chip having at least one electrical conductor on a daughterboard; providing at least one operational amplifier to the daughterboard; electrically connecting the at least one electrical conductor of the at least one bridge chip on the daughterboard to the at least one operational amplifier on the daughterboard; and attaching the daughterboard to the motherboard.

BRIEF DESCRIPTION OF THE DRAWINGS

A more complete understanding of the present invention will become apparent from the following description taken in conjunction with the accompanying drawings.

DETAILED DESCRIPTION OF THE PREFERRED EMBODIMENTS

Figure 1:
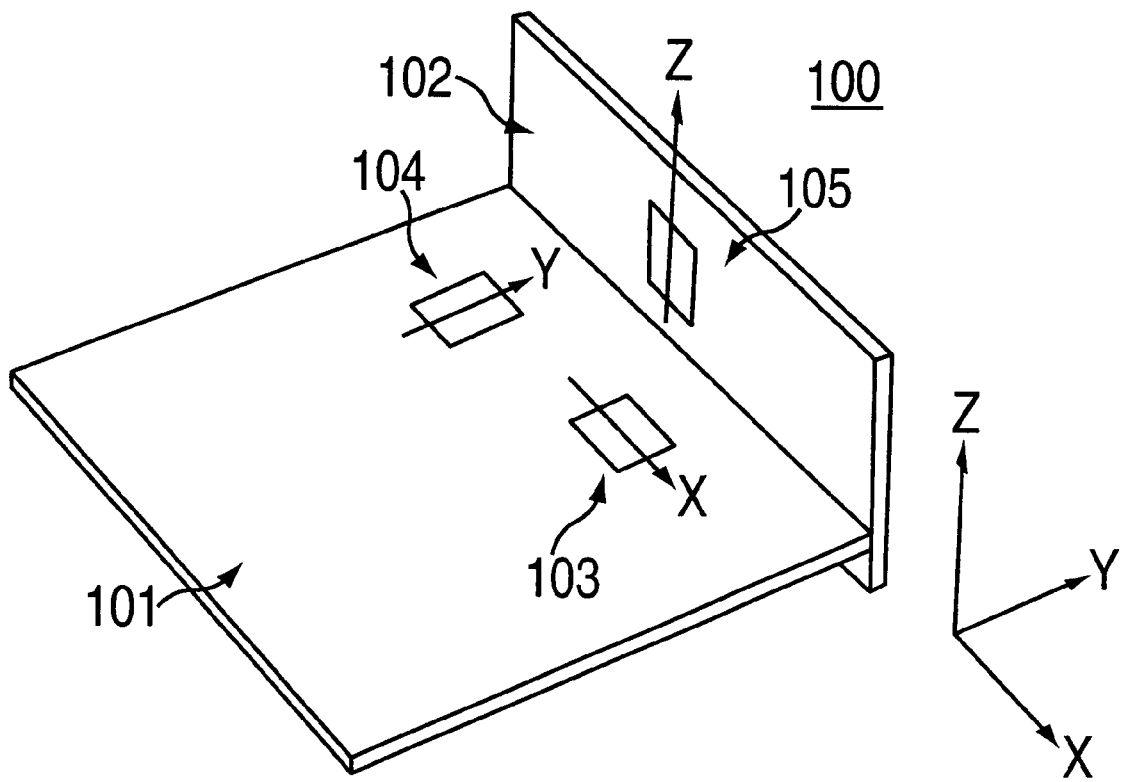
FIG. 1 is a schematic illustration of a multi-axis magnetometer assembled in accordance with the present invention.

Preferred embodiments of the present invention will be described in detail with reference to the attached drawings. With reference to FIG. 1, there is illustrated the essential construction of a three-axis magnetometer of the present invention designated generally by reference numeral 100. The magnetometer 100 includes a printed circuit board (PCB) 101 which acts as a motherboard to a daughterboard 102, i.e., another PCB, attached thereto. Magnetic field sensing circuit components 103 and 104 (see FIG. 4), for example magnetoresistive or Hall effect materials assembled into integrated circuit packages or hard-wired components, are mounted to the PCB 101. An additional magnetic field sensing circuit component 105 is mounted on the PCB 102 before attachment of the PCB 102 to PCB 101. Magnetic field sensing circuit component 105 is preferably identical to the magnetic field sensing circuit components 103 and 104. The operation of the magnetic field sensing circuit components 103, 104 and 105 as arranged according to the present invention is described hereinbelow with reference to FIG. 4. It is contemplated that additional circuitry would be mounted on the motherboard 101 and daughterboard 102 of the magnetometer 100 which is independent from the circuitry of the magnetometer 100.

According to the method of fabricating the magnetometer 100 of the present invention, the angular orientations of the individual magnetic field sensing circuit components 103, 104 and 105 are adjusted to sense and measure accurately the three orthogonal components of an external magnetic field along three dimensions or axes, i.e., the X, Y and Z axes.

Figure 2A:
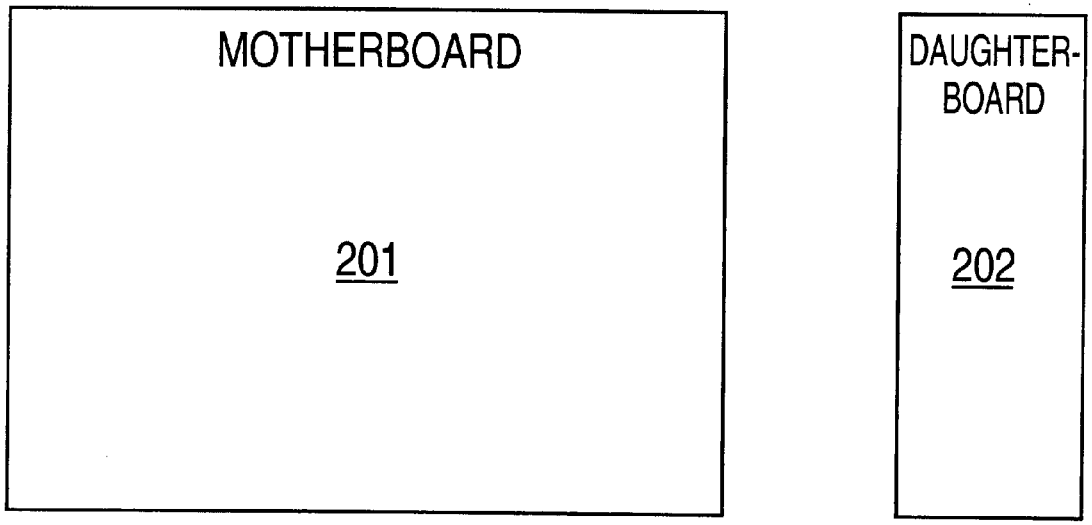
FIG. 2a is a schematic illustration of one configuration of a motherboard and a daughterboard prior to assembly.
Figure 2B:
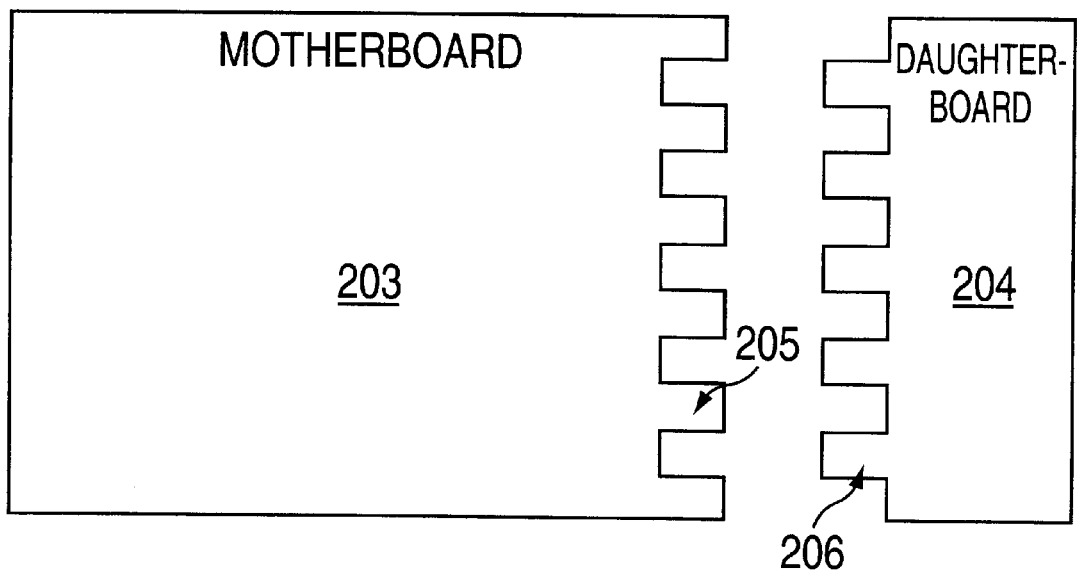
FIG. 2b is a schematic illustration of another configuration of a motherboard and a daughterboard prior to assembly.

Further, it is contemplated to design the edges of the motherboard and daughterboard according to the designs shown by FIGS. 2a and 2b to attain a desired level of mechanical stability after attaching the daughterboard to the motherboard. In FIG. 2a, the motherboard 201 and daughterboard 202 are fabricated with straight edges. During assembly, the daughterboard 202 would be abutted against the motherboard as shown in FIG. 1, preferably by means of an orienting jig, and attached thereto by solder, adhesive, or other fixture means.

FIG. 2b shows another construction of the motherboard 203 and daughterboard 204. The edges of the motherboard 203 and the daughterboard 204 are fabricated with interlocking slot or teeth patterns 205 and 206. The number, dimension, shape and placement of these slots can be chosen to conform with the particular requirements for electrical connection. During assembly, the slot pattern 206 of the daughterboard 204 is inserted into the mating slot pattern 205 of the motherboard 203, preferably by means of an orienting jig, and attached thereto by solder, adhesive, or other fixture means, to attain the orientation of motherboard and daughterboard as shown in FIG. 1.

With reference to the assembly configuration of FIG. 2b, there are at least two advantages. First, the height of the daughterboard 204 above the motherboard 203 can be varied by moving one slot pattern within the other before attaching the daughterboard 204 to the motherboard 203. Second, one can provide solder or adhesive to both sides of the daughterboard 204 for providing additional mechanical stability to the daughterboard/motherboard assembly.

Several methods for attaching the daughterboard to the motherboard to attain the design configuration shown in FIG. 1 are illustrated by FIGS. 3a–3d. As indicated above, the daughterboard is preferably attached to the motherboard by solder, adhesive, or other fixture means. Further, since electrical connection between the motherboard and daughterboard is required, the attachment methods of FIGS. 3a–3d can serve as electrical attachment, mechanical attachment, or both simultaneously.

Figure 3A:
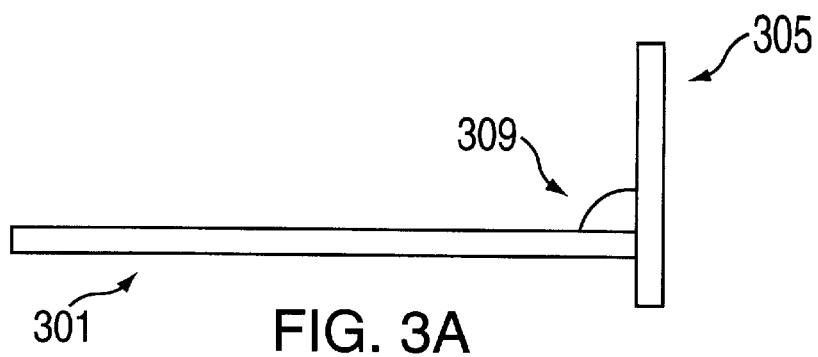
FIGS. 3a, 3b, 3c and 3d are schematic illustrations of various methods of solder fastening a daughterboard to a motherboard.
Figure 3B:
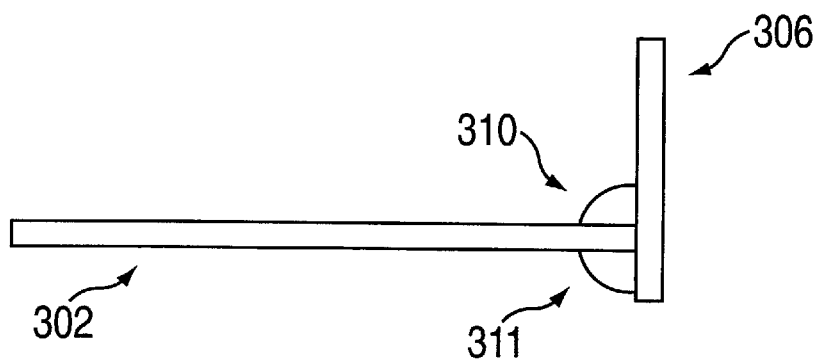

As shown in FIG. 3a, a motherboard 301 and daughterboard 305 having the design configuration of FIG. 2a are attached by solder, adhesive, or other fixture means 309 at one side of the boards. With reference to the attachment method of FIG. 3b, greater mechanical stability can be obtained using the design configuration of FIG. 2a. Additionally, the attachment method of FIG. 3b provides a means of electrical connection of one side of the daughterboard 306 to both sides of the motherboard 302 by solder, adhesive, or other fixture means 310 and 311.

Figure 3C:
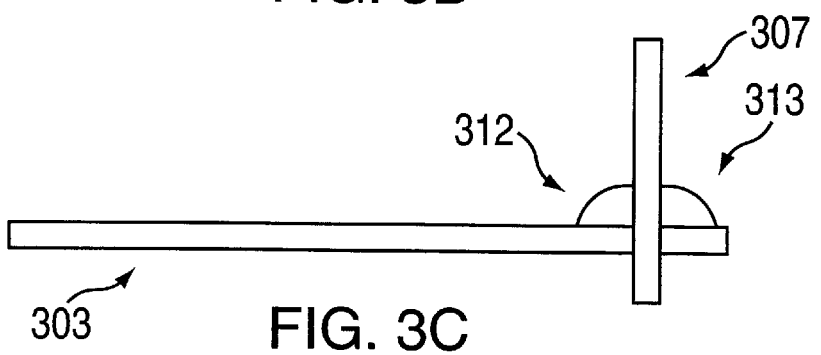
Figure 3D:
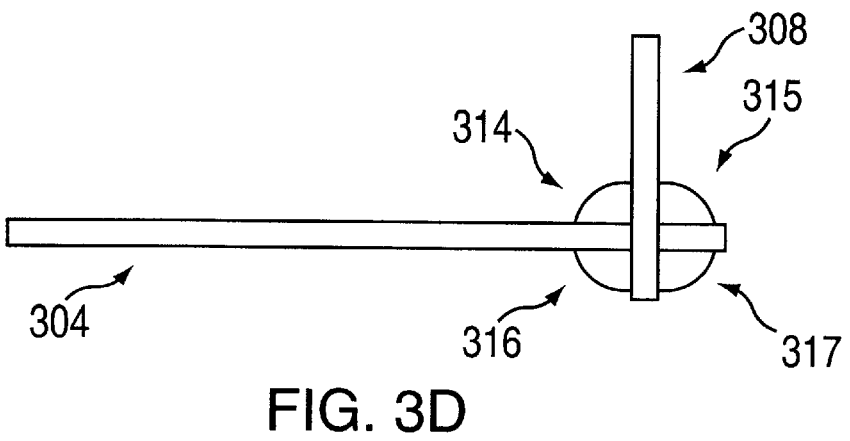

Using the slot pattern interlocking attachment pattern of FIG. 2b, the further attachment schemes of FIGS. 3c and 3d can be realized. With reference to FIG. 3c, motherboard 303 is first interlocked with daughterboard 307 and then the latter is attached to the former by solder, adhesive, or other fixture means 312 and 313 at both sides of the daughterboard 307. In the attachment method of FIG. 3d, motherboard 304 is first interlocked with daughterboard 308 and then the latter is attached to the former by solder, adhesive, or other fixture means 314, 315, 316 and 317 at both sides of the motherboard 304 and daughterboard 308.

Figure 4:
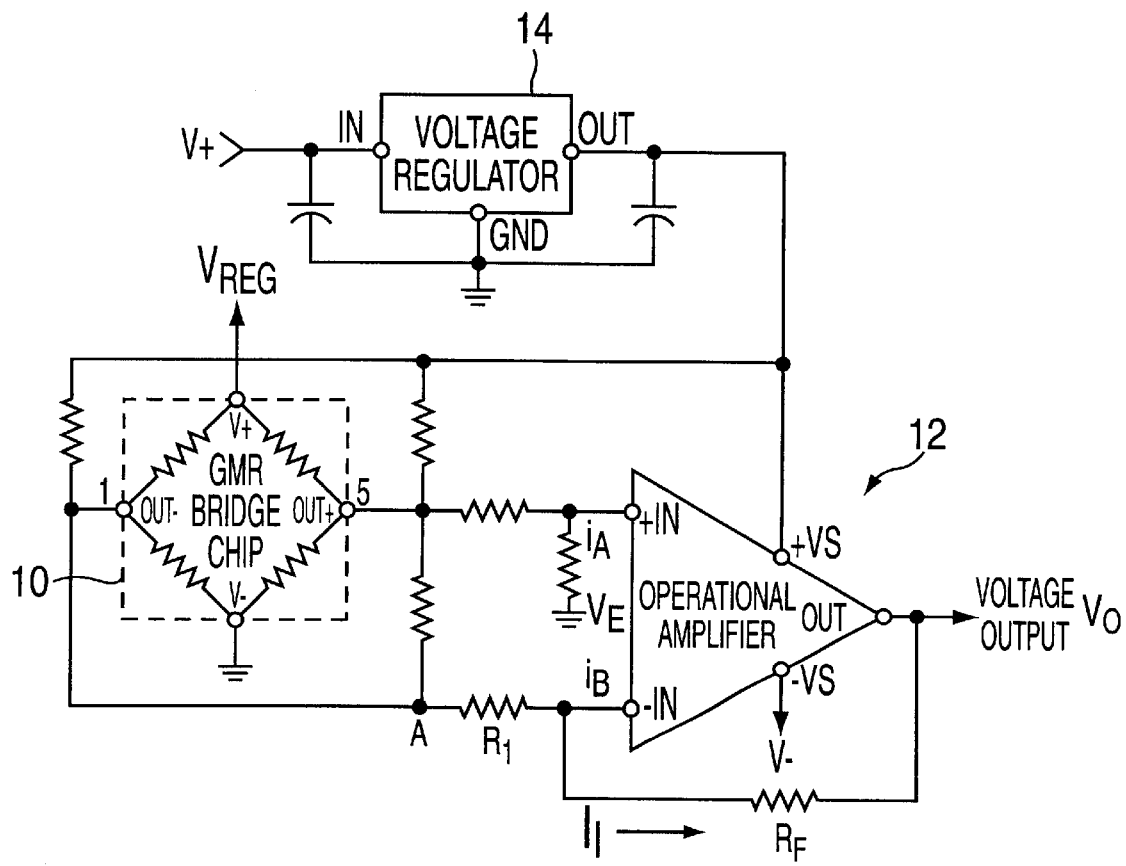
FIG. 4 is a schematic of electronic circuitry used for each axis of the multi-axis magnetometer according to the present invention.

With reference to FIG. 4, there is shown a schematic of the electronic circuitry used in the multi-axis magnetometer 100 of the present invention. The sections of the circuitry including the GMR bridge chip 10 and a non-inverting operational amplifier 12 are identical for each axis of the multi-axis magnetometer 100. The voltage regulator 14 is shared by the three axes. It is contemplated that the circuitry is produced on a ceramic motherboard and daughterboard using screen printing techniques and surface mounted component techniques as known in the art.

A description of the electronic circuitry of FIG. 4 will now be provided. It is known for a non-inverting operational amplifier that $v_\epsilon=0$, and therefore a signal $v_I$ appears across $R_1$ producing a current $I_I$ equal to $v_I/R_1$. This current must flow through resistor $R_F$, since $i_A$ and $i_B$ are equal to zero. Hence, the output voltage ($v_o$) is equal to the sum of the voltage drops across $R_F$ and $R_1$ as shown by Equation 1 below.

$$v_o=-[R_F(v_I/R_1)+v_I]=-(1+R_F/R_1)v_I=-(v_I+R_F I_I) \qquad \text{Eq. 1}$$

According to Equation 1, the output voltage is directly proportional to $(v_I+R_F I_I)$, therefore as the current $I_I$ increases, the output voltage increases. The magnitude of current $I_I$ depends primarily upon the currents flowing through the bridge chip 10. A portion of these currents flow toward node A from node 1 of the bridge chip 10 and a portion of these currents flow toward node A from node 5 of the bridge chip 10. At node A, these currents from the bridge chip 10 merge, thereby increasing the value of $I_I$. As the value of $I_I$ increases, the output voltage also increases.

The magnitude of the currents flowing through the wires (electrical conductors) and resistors of the bridge chip 10 depends on the magnitude of the applied magnetic field surrounding the bridge chip 10. It is known that a magnetic field surrounding or in the vicinity of an electrical conductor, such as a wire, produces a current through the electrical conductor.

Figure 5:
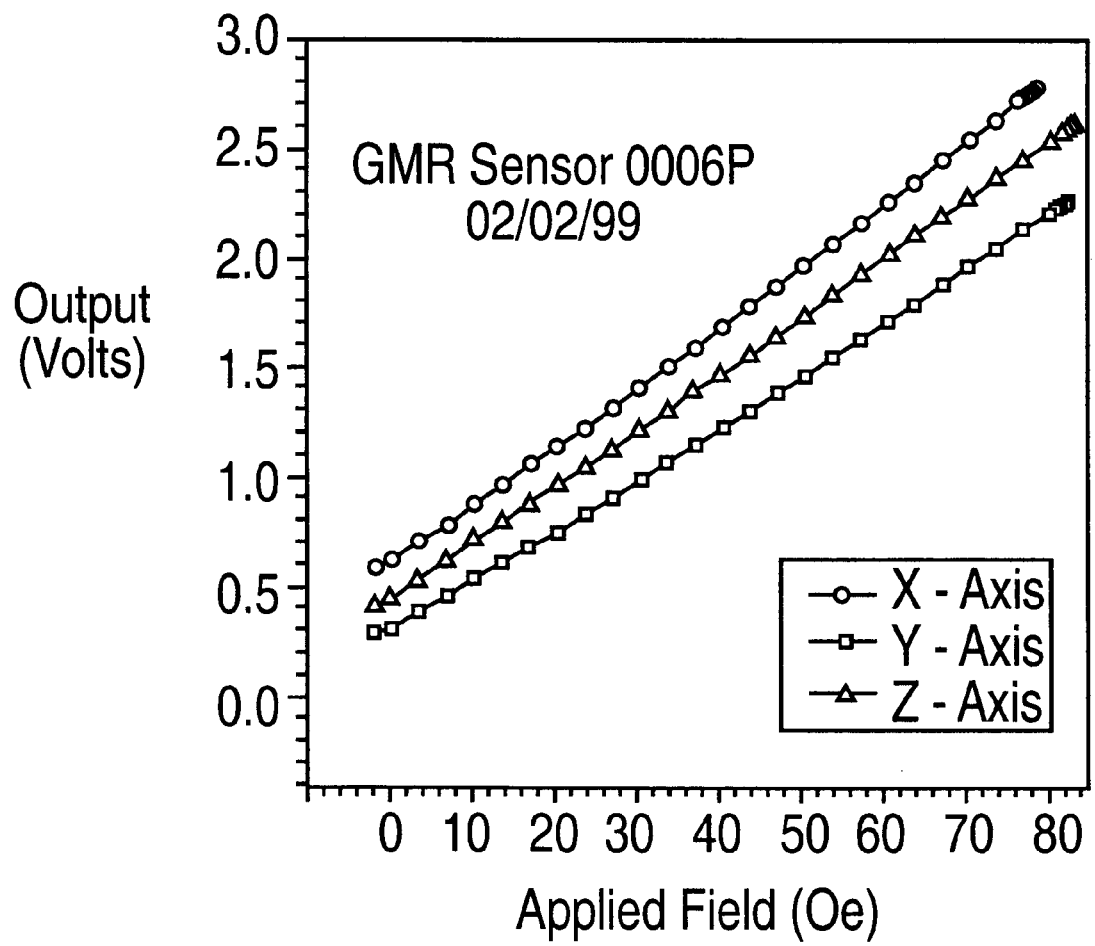
FIG. 5 is a graph illustrating the performance of the multi-axis magnetometer of the present invention.

FIG. 5 is a graph illustrating the performance of the multi-axis magnetometer 100 of the present invention as a magnetic field sensor for three orthogonal field directions, i.e., X, Y and Z axes, in the range of about 0 to 80 Oersted (Oe). As shown by FIG. 5, as the applied magnetic field increases from 0 to 80 Oe, the output voltage of the magnetometer 100 for each axis increases to indicate an increase in the applied magnetic field surrounding the bridge chip 10.

It is contemplated that the magnetometer 100 of the present invention can be used by an operator to sense and measure the magnitude of any magnetic fields in proximity to sensitive electronic circuitry. By using the multi-axis magnetometer of the present invention, the operator can measure the output voltage for each axis as shown by FIG. 5. If the output voltage exceeds a predetermined threshold value for the applied magnetic field, the operator can take appropriate action to decrease or stabilize the applied magnetic field surrounding the bridge chip 10 to prevent any damage to the sensitive circuitry being tested.

It is also contemplated to provide permanently the multi-axis magnetometer 100 of the present invention within electronic circuitry and to provide an alarm/shut-off mechanism for shutting off the operation of the electronic circuitry if the output voltage of the magnetometer 100 exceeds a predetermined threshold.

While the present invention has been described in detail with reference to the specific embodiments, they are mere exemplary applications. Thus, it is to be clearly understood that many variations can be made by anyone skilled in the art within the scope and spirit of the present invention as defined by the claims.

What is claimed is:

1. A multi-axis magnetometer for measuring the magnetic field intensity along three orthogonal axes, said magnetometer comprising a rigid mother circuit board, a rigid daughter circuit board;

first and second magnetic field sensing circuits orthogonally located on said mother circuit board, a third magnetic field sensing circuits located on said daughter circuit board and orthogonal to said first and second magnetic field sensing devices, operational amplifiers on said mother and daughter circuit boards and each connected to one of said magnetic field sensing devices, and fixture means securing said daughter circuit board to said mother circuit board and providing electrical interconnection between said mother circuit board and said daughter circuit board.

2. The multi-axis magnetometer in accordance with claim 1 wherein said fixture means comprises solder.

3. The multi-axis magnetometer in accordance with claim 1 wherein said fixture means comprises a conductive epoxy adhesive.

4. The multi-axis magnetometer in accordance with claim 1 wherein said fixture means includes interlocking teeth on said rigid mother and daughter circuit boards.

5. The multi-axis magnetometer in accordance with claim 1 wherein each magnetic field sensing circuit is a bridge chip and further comprising for each magnetic field sensing circuit a first connection including a first resistor from one terminal of the bridge chip to a first input of an operational amplifier, a second connection from a second terminal of the bridge chip through a second resistor to a second input of the operational amplifier, a third resistor connecting said first and second terminals of the bridge chip, a feedback resistor connecting the operational amplifier output to said second input of the operational amplifier, the output voltage at said operational amplifier output depending on the magnitude of an input current flowing through said feedback resistor, and a voltage regulator connected to a third terminal of the bridge chip, to the operational amplifier, to said first bridge chip terminal through a fourth resistor, and to said second bridge chip terminal through a fifth resistor.

* * * * *